United States Patent

[11] 3,586,989

[72] Inventor Desmond Wheable
Farnborough, England
[21] Appl. No. 882,175
[22] Filed Dec. 4, 1969
[45] Patented June 22, 1971
[73] Assignee The Solartron Electronic Group Limited
Farnborough, England
[32] Priority Dec. 31, 1968
[33] Great Britain
[31] 61927/68

[54] TIME SHARED AMPLIFIERS
7 Claims, 3 Drawing Figs.

[52] U.S. Cl. ........ 330/51, 330/35, 307/241, 307/251
[51] Int. Cl. ........ H03f 3/16, H03f
[50] Field of Search ........ 330/51; 307/241, 251

[56] References Cited
UNITED STATES PATENTS
3,070,786 12/1962 MacIntyre ........ 340/347

*Primary Examiner*—Nathan Kaufman
*Attorneys*—William R. Sherman, Stewart F. Moore, Jerry M. Presson and Roylance, Abrams, Kruger, Berdo and Kaul

ABSTRACT: In known time shared amplifiers, voltage drift stabilization is effected by periodically shorting the amplifier output to the amplifier input while connecting the input terminal to a reference potential to charge an input character, which then supplies a corrective offset. This does not however effect current drift stabilization, which is effected according to the invention by a capacitor and resistor in series between the amplifier input and the reference potential. The amplifier output is now periodically shorted to the junction of the resistor and capacitor. The charge established on the capacitor then supplies an offset current through the resistor.

TIME SHARED AMPLIFIERS

BACKGROUND AND PRIOR ART

This invention relates to time-shared amplifiers in which stabilization against drift is effected by alternately applying an input signal (operative phase) and a reference signal, such as ground, (correcting phase) to the amplifier. Known time-shared amplifiers comprise an input terminal connected to the amplifier input through an input switch and a capacitor. Further switches are provided for intermittently shorting the input terminal to reference potential and simultaneously shorting the amplifier output to the amplifier input to establish THE drift correcting voltage across the capacitor. This represents the correcting phase in which the input switch is open. The input switch is closed to apply the input voltage in the operative phase when the first and second switches are open circuit. Such arrangements suffer from the disadvantage that, although the voltage drift is corrected, the corresponding input current drift remains, and during the operative phase, an offset current has to be supplied by the source of the input signal. If this source has high impedance the effect can be serious. What is more the input switch, which is typically a field effect transistor (FET) does not have infinite impedance when open and the leakage current influences the charge on the input capacitor.

The INVENTION

The object of this invention is to reduce such problems. According to the instant invention, a resistor and capacitor are connected in series between the input of the amplifier and the source of reference signal and switch means are connected between the output of the amplifier and the junction of the resistor with the capacitor. The switch means are controlled to be open in the operative phase to close in the correcting phase to charge the capacitor to a level dependent upon the value of the offset current of the amplifier.

The effect of this provision is that, at the end of the correcting phase, the voltage at the said junction is such that the drop across the resistor supplies the offset current and, assuming that the added capacitor is suitably large, this current continues to be supplied throughout the following operative phase. The drain on the signal source is thus removed.

The invention may be applied with various amplifier configurations. If the amplifier is a straight-forward operational amplifier the conventional input capacitor may or may not additionally be required for correcting for the offset voltage. In differential and potentiometric configurations the input capacitor will normally be required and in the differential configuration this may be connected to the input other than that to which the series resistor and capacitor are connected.

In the potentiometric configuration first and second output terminals are connected respectively to the amplifier output and the reference potential source while two input terminals are connected the one through a conventional input capacitor to the amplifier input (to which the series resistor and capacitor are connected) and the other to an intermediate point of a potential divider which is connected across the output terminals.

A further improvement can be effected in this configuration by including an output switch between the amplifier output and the first output terminal, this switch being opened in the correcting phase, and by including a further capacitor in parallel with the potential divider. As a result, in the correcting phase the output voltage across the potential divider is maintained and it is therefore no longer necessary to include the input switch to isolate the input during this phase. Preferably however an input resistor is included to limit the initial charging current.

Preferably a buffer amplifier of more or less unity gain, for example an emitter follower, is employed between the further capacitor and the potential divider.

The invention will be described in more detail, by way of example, with reference to the accompanying drawings, in which.

Figure 1:
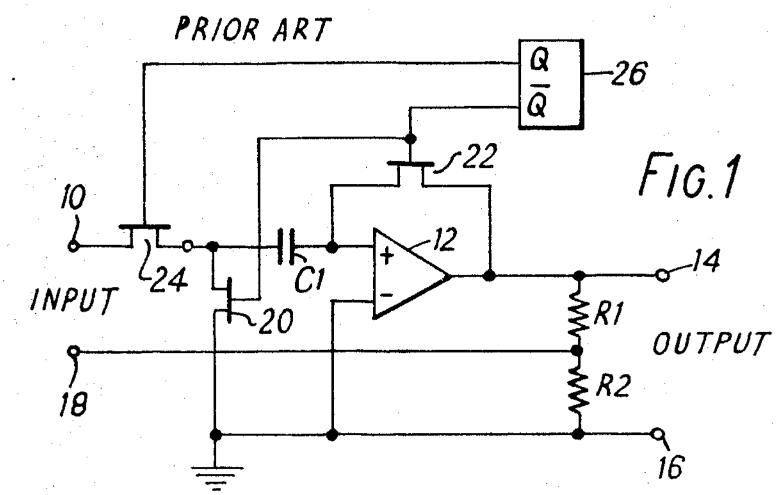
FIG. 1 is a schematic diagram of a known time-shared amplifier.

In the known arrangement of FIG. 1 a first input terminal 10 is connected to the positive (+) input of a differential amplifier 12 through a capacitor $C_1$ whose value may be 0.1 $\mu f$. The output of the amplifier is connected to a first output terminal 14. The negative (−) input of the amplifier 12 and the second output terminal 16 are connected to ground. A potential divider composed of resistors $R_1$ and $R_2$ is connected between the terminals 14 and 16 and the second input terminal 18 is connected to the junction of $R_1$ and $R_2$. $R_1$ should be substantially larger than $R_2$, e.g. $R_1$=99K and $R_2$=1K.

A first switch 20 is connected between the input terminal 10 and ground. A second switch 22 is connected between the output of the amplifier and the +input. Both these switches, and others referred to, may consist of FET's, as shown in the drawings. An input switch 24 is interposed between the input terminal 10 and the capacitor $C_1$ for isolating the input during the correcting phase. The switches are driven in any convenient manner so that operative phases in which 24 is closed and 20 and 22 are open alternate with correcting phases in which 24 is open and 20 and 22 are closed. As illustrated, 24 is driven from the Q 1 output of a free running multivibrator 26 while 20 and 22 are driven from the $\overline{Q}$ output. The two states of the multivibrator thus determine the operative and correcting phases respectively.

Conventional circuit techniques must be employed to ensure that the switch 24 closes after 20 and 22 open and that 20 and 22 close after 24 opens.

In the correcting phase the voltage at the output of the amplifier equals the drift at the input and $C_1$ is charged accordingly. In the operative phase the drift referred to the input is reduced by the ratio $(R_1+R_2)/R_2$. This arrangement nevertheless suffers from the disadvantages already described.

Large parts of the embodiments of the invention now to be described are the same as FIG. 1 and the same reference numerals are used. Attention is concentrated in the following description upon the differences from FIG. 1.

Figures 2, 3:
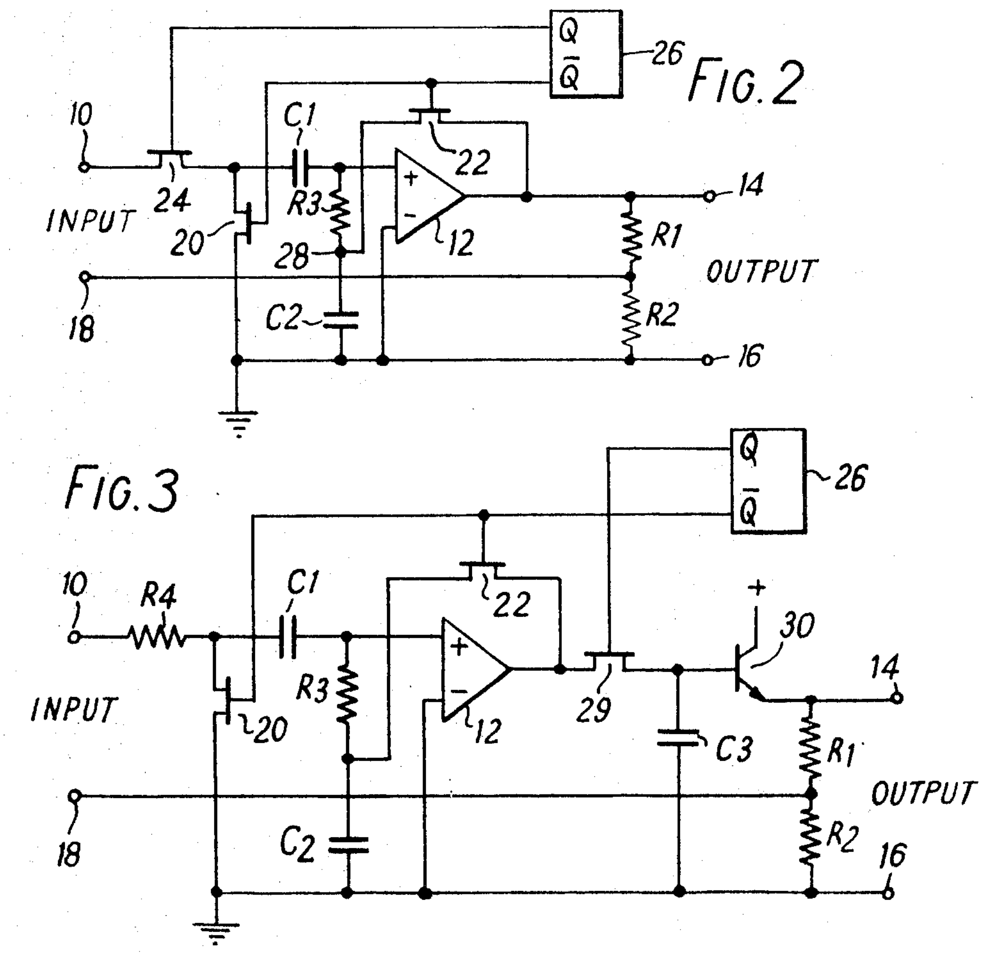
FIGS. 2 and 3 are schematic diagrams of two embodiments of the present invention.

Thus in FIG. 2 a resistor $R_3$ and capacitor $C_2$ in series have been added between the + and − inputs latter being ground) of the amplifier 12. The switch 22 is now connected between the amplifier output and the junction 28 between $R_3$ and $C_2$. As already explained in general terms, in the correcting phase $C_2$ charges to bring the junction 28 to such a potential that $R_3$ just supplies the necessary drift offset current. $C_2$ is large enough, e.g. 1 $\mu f$. for $R_3$=100K, to supply this current throughout the following operative phase. This current may be as much as 1 $n$ A.

In the further improvement shown in FIG. 3 the input switch 24 is omitted and replaced by a resistor $R_4$. An output switch 29 is connected between the amplifier output and the terminal 14 and is driven out of phase with 20 and 22 from the Q output of the multivibrator 26. A capacitor $C_3$ is placed in parallel with the potential divider $R_1$, $R_2$ but is buffered therefrom by an emitter follower 30.

In the correcting phase the switch 29 isolates the amplifier output from the capacitor $C_3$ which maintains the output potential across $R_1$ and $R_2$ via the buffer amplifier 30, whereby it becomes possible to dispense with the troublesome input switch 24 of FIGS. 1 and 2.

I claim:

1. A time-shared amplifier comprising an amplifier having an input and output, an input impedance connected to said amplifier input, an input terminal for receiving an input electrical signal, a source of a reference electrical signal, first switch means and control means therefor operative to effectively connect said input terminal and reference source alternately to said input impedance during successive operative and correcting phases, a resistor connected at one end to said amplifier input, a capacitor having one end connected to the other end of said resistor and having the other end connected to said reference source, and further switch means responsive to said control means to connect said amplifier output to the junction of said one end of said capacitor with said other end of said resistor during said correcting phases.

2. A time-shared amplifier according to claim 1, wherein said input impedance is a capacitor.

3. A time-shared amplifier according to claim 1, wherein said first switch means comprises two switch means respectively connecting said input terminal and said reference source to said input impedance and responsive to said control means to open and close out of phase with each other.

4. A time-shared amplifier according to claim 1, wherein said first switch means comprise a switch means connecting said reference source to said input impedance and responsive to said control means to close during said correcting phases, the amplifier further comprising an input resistor connected between said input terminal and said input impedance.

5. A time-shared amplifier according to claim 1, comprising first and second output terminals connected respectively to said amplifier output and said reference source, a potential divider connected across said output terminals and having an intermediate tap, and first and second input terminals connected respectively to said input impedance and said intermediate tap.

6. A time-shared amplifier according to claim 5, comprising an output switch means connected between said amplifier output and said first output terminal and responsive to said control means to open during said correcting phases, and a further capacitor connected in parallel with said potential divider.

7. A time-shared amplifier according to claim 6, comprising a buffer amplifier connected between said further capacitor and said potential divider.